US008742374B2

(12) United States Patent
Naito

(10) Patent No.: US 8,742,374 B2
(45) Date of Patent: Jun. 3, 2014

(54) ION IMPLANTATION APPARATUS

(71) Applicant: Nissin Ion Equipment Co., Ltd, Kyoto (JP)

(72) Inventor: Masao Naito, Kyoto (JP)

(73) Assignee: Nissin Ion Equipment Co., Ltd, Kyoto (JP)

( * ) Notice: Subject to any disclaimer, the term of this patent is extended or adjusted under 35 U.S.C. 154(b) by 0 days.

(21) Appl. No.: 13/970,406

(22) Filed: Aug. 19, 2013

(65) Prior Publication Data
US 2014/0053778 A1   Feb. 27, 2014

(30) Foreign Application Priority Data
Aug. 21, 2012   (JP) .................. 2012-182093

(51) Int. Cl.
H01J 37/317   (2006.01)
H01J 37/20    (2006.01)
H01L 21/265   (2006.01)

(52) U.S. Cl.
USPC ............... 250/492.21; 250/492.2; 250/492.3; 250/492.22; 250/396 R

(58) Field of Classification Search
USPC ...... 250/492.21, 492.2, 492.22, 492.3, 396 R
See application file for complete search history.

(56) References Cited

U.S. PATENT DOCUMENTS

| 5,350,926 A | 9/1994 | White et al. |
| 8,461,548 B2* | 6/2013 | Nicolaescu et al. ... 250/396 ML |
| 8,552,404 B2* | 10/2013 | Asai et al. ............... 250/492.22 |
| 8,653,490 B2* | 2/2014 | Naito ....................... 250/492.3 |

FOREIGN PATENT DOCUMENTS

JP   06-342639 A1   12/1994
JP   11-260309 A1   9/1999

* cited by examiner

Primary Examiner — Nikita Wells
(74) Attorney, Agent, or Firm — Procopio, Cory, Hargreaves & Savitch LLP

(57) ABSTRACT

A hybrid ion implantation apparatus that is equipped with shaping masks that shape the two edges of a ribbon-like ion beam IB in the short-side direction, a profiler that measures the current distribution in the long-side direction of the ion beam IB shaped by the shaping masks, and an electron beam supply unit that supplies an electron beam EB across the entire region in the long-side direction of the ion beam IB prior to its shaping by the shaping masks, wherein the electron beam supply unit varies the supply dose of the electron beam EB at each location in the long-side direction of the ion beam IB according to results of measurements by the profiler.

7 Claims, 11 Drawing Sheets

ION IMPLANTATION APPARATUS

CROSS-REFERENCE

This application claims the benefit of Japanese Patent Application No. 2012-182093, filed Aug. 21, 2012, the disclosure of which is hereby incorporated by reference in its entirety.

BACKGROUND

1. Field

The present invention relates to an ion implantation apparatus configured to adjust the distribution of beam current in the longitudinal direction of a ribbon-like ion beam.

2. Background

Among the known types of ion implantation apparatuses are hybrid ion implantation apparatuses that introduce a ribbon-like ion beam into a processing chamber, move a substrate (a semiconductor substrate such as a silicon wafer) so that the substrate crosses the ion beam in a direction that intersects the short-side direction of the introduced ion beam, and thereby implants ions into the substrate.

This type of ion implanter is provided with a means that adjusts the uniformity of the ion beam current distribution in the long-side direction of the ribbon-like ion beam so that the amount of ion irradiation (dose) implanted into the substrate is uniform within the substrate surface.

A specific architecture, as disclosed in Patent Document 1, placed a plurality of pole pieces along the long-side direction of the ribbon-like ion beam in the magnetic pole part of a mass analyzing electromagnet and utilized a technique of adjusting the uniformity of the current distribution in the longitudinal direction of the ribbon-like ion beam by varying the magnetic field distribution in the longitudinal direction of the ribbon-like ion beam by adjusting the lengths of the pole pieces that protrude into the interior of the electromagnet.

[Patent Document 1] JP-A-H06-342639

SUMMARY

The uniformizing adjustment means recited in Patent Document 1 is a technique that locally varies the direction of travel of ions contained within the ion beam using a magnetic field in the long-side direction of the ribbon-like ion beam to thereby adjust the uniformity of the current distribution of the ion beam in that direction. When this adjustment technique is utilized, the current distribution of the ion beam in the long-side direction can be adjusted to uniformity, but major discrepancies are generated in the direction of travel of the ions contained in the ion beam across the long-side direction of the ion beam when uniformity is adjusted because the direction of ion travel is locally varied using a magnetic field. These discrepancies arise from the strength of the Lorentz force that acts in a direction orthogonal to the direction of ion travel and the magnetic field direction locally varying across the long-side direction of the ion beam as the magnetic field distribution is changed.

In recent years, the dimensions of semiconductor device architectures have become smaller, and those architectures have become steadily more complex. To achieve the desired ion implantation in substrates that have this type of semiconductor device architecture, the range of the described discrepancies that can be tolerated becomes quite small. The tolerance for these discrepancies shrinks as dimensions become smaller, so the technique recited in Patent Document 1 of adjusting the uniformity of the current distribution in the long-side direction of the ion beam by locally varying the direction of ion travel was insufficient to handle miniaturization.

The main purpose of the present invention is therefore to provide an ion implantation apparatus that not only makes the current distribution in the long-side direction of an ion beam uniform, but also does not result in the uniformity adjustment generating major discrepancies in the direction of travel of ions contained in the ion beam at various locations in that direction.

The ion implantation apparatus of the present invention is an ion implantation apparatus that moves a substrate in a direction that intersects the short-side direction of a ribbon-like ion beam in a processing chamber to thereby irradiate the ion beam over the entire surface of the substrate that is equipped with shaping masks that shape the two edges of the ion beam in the short-side direction prior to irradiation of the ion beam on the substrate, a profiler that measures the current distribution in the long-side direction of the ion beam shaped by the shaping masks, and an electron beam supply unit that supplies an electron beam for the ion beam across the entire region in the long-side direction of the ion beam on the upstream side of the shaping masks, wherein the electron beam supply unit varies the supply dose of the electron beam at each location in the long-side direction of the ion beam according to results of measurements by the profiler.

More specifically, the electron beam supply unit is equipped with an electron beam generating apparatus, which generates the electron beam, and either an electron beam scanning apparatus, which scans the electron beam generated by the electron beam generating apparatus in one direction, or a current distribution adjusting apparatus, which adjusts the current distribution of the electron beam generated by the electron beam generating apparatus.

With this sort of architecture, the electron beam supply dose can be varied at each location in the long-side direction of the ion beam and the ion beam current distribution can be adjusted. When this sort of technique is used, the direction of travel of the ions contained in the ion beam does not change excessively when the current distribution is adjusted. This means that, compared to prior art techniques, discrepancies in the direction of travel of ions at each location in the direction of the long-side of the ion beam can be minimized, so miniaturization of semiconductor devices can be sufficiently handled.

Further, the electron beam generating apparatus may be equipped with a radio frequency plasma source and an extracting electrode for extracting an electron beam from a radio frequency plasma source.

With this sort of architecture, there is no need to consider maintenance of the apparatus due to wear, or broken connections due to filament sputtering. For this reason, the electron beam generating apparatus can be operated over relatively long periods of time with stability. Further, since there is no infiltration of metal particles generated from the filament into substrates, no problems of metal contamination arise.

It is desirable have an architecture in which at least one solenoid coil that generates a magnetic field roughly parallel to the direction of travel of the ion beam is disposed on the beam path on which the ion beam is transported in order to make the electron beam efficiently help suppress diffusion of the ion beam.

With this sort of architecture, electrons can be transported along the direction of travel of the ion beam, so diffusion of the ion beam can be sufficiently suppressed. Also, since the electron utilization efficiency increases, the dose of electrons supplied can be reduced, and the output of the electron beam generating apparatus can be lowered. The power consumption of the apparatus and the wear on cathodes, which are sources that generate the electrons, should also be reduced.

Further, the beam path on which the ion beam is transported may be within a vacuum chamber, and a profiler for measuring the current distribution of the electron beam may be supported on a wall of the vacuum chamber.

With this sort of architecture, the current distribution of the electron beam is measured and the current distribution of the electron beam is adjusted based on the measurements prior to its supply to the ion beam, so the electron beam current distribution can be adjusted accurately.

Further, an architecture may be used in which, prior to ion implantation processing of the substrate, the profiler that measures the current distribution of the ion beam is disposed at an implantation position where the ion beam is irradiated on the substrate during ion implantation.

With this sort of architecture, the current distribution of the ion beam irradiated on the substrate can be adjusted more accurately.

Further, an architecture may be used in which the shaping masks are equipped with a mask-width-varying apparatus that can variably change the mask width in the short-side direction of the ion beam.

The way that the ion beam spreads due to the space-charge effect varies with the ion source used and its energy. If an apparatus is installed that variably changes mask width, the two edges of the ion beam in the short-side direction can be shaped accurately by changing the mask width as appropriate for such changes in the ion beam.

EFFECTS OF THE INVENTION

The ion beam current distribution is adjusted by varying the supply dose of the electron beam for each location in the long-side direction of the ion beam, so the direction of travel of ions in the ion beam does not vary excessively as the current distribution is adjusted. This means that, compared to prior art techniques, discrepancies in the direction of travel of ions at each location in the direction of the long-side of the ion beam can be minimized, so miniaturization of semiconductor devices can be sufficiently handled.

DETAILED DESCRIPTION OF EMBODIMENTS

Figure 1:
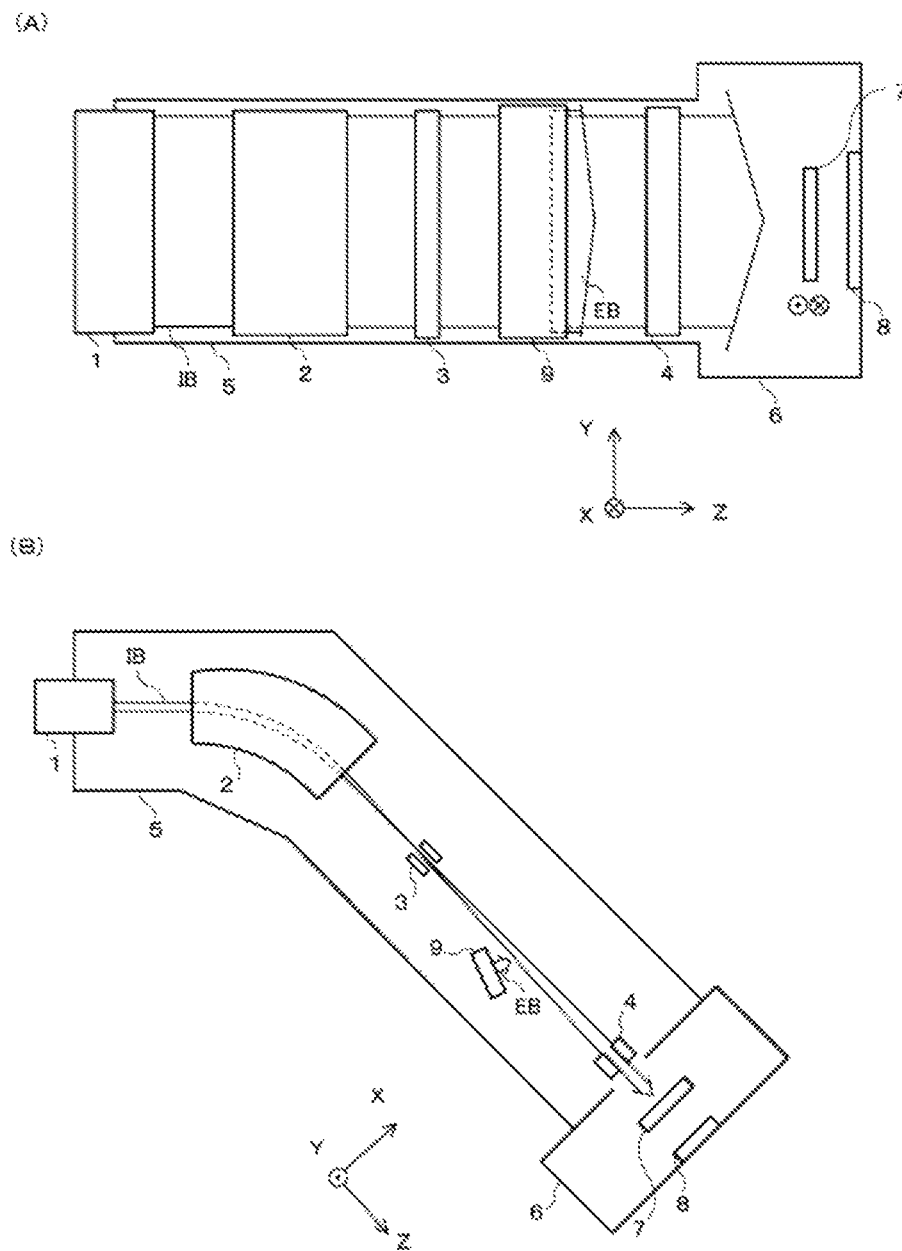
FIG. 1 is a plan view of an ion implantation apparatus according to the present invention. (A) illustrates a state seen from a Y-Z plane; (B) illustrates a state seen from an X-Z plane.

FIGS. 1 (A) and 1 (B) are plan views of the ion implantation apparatus according to the present invention. (A) illustrates a state seen from a Y-Z plane; (B) illustrates a state seen from an X-Z plane. In the following explanation, the Z-axis direction (Z direction) is the direction of travel of a ribbon-like ion beam; the Y-axis direction (Y direction) is the long-side direction of the ribbon-like ion beam. Further, the X-axis direction (X direction) is the short-side direction of the ribbon-like ion beam. The ions described in the present invention are ions that have positive charge.

Ion beam IB is generated by an ion source 1 and transits a mass analyzing electromagnet 2 and a resolving aperture 3 disposed downstream of it. The mass analyzing electromagnet 2 and resolving aperture 3 perform mass analysis on the ion beam IB, and make an ion beam IB that includes ions of the desired mass pass through to the downstream side of the resolving aperture 3.

An electron beam EB is supplied by an electron beam supply unit 9 to the ion beam IB that has transited the resolving aperture 3 across the entire area of its long-side direction. The present invention adjusts the current distribution in the long-side direction of the ion beam IB by this electron beam EB adjusting the degree of diffusion due to the space-charge effect according to the position in the long-side direction of the ion beam IB; the specific architecture is described below.

After it has transited the area where the electron beam EB is supplied, the ion beam IB transits shaping masks 4. Under the influence of the space-charge effect, the ion beam IB gradually diffuses while traveling in the Z direction. Here, the width in the short-side direction of the diffused ion beam IB is shaped by the shaping masks 4 to a prescribed width.

After it transits the shaping masks 4, the ion beam IB is introduced into a processing chamber 6. A substrate 7 is disposed within the processing chamber 6, and the substrate 7 is moved in the X direction by a support mechanism (not shown) and a driving means that drives it. The dimensions of the substrate 7 are shorter than the ion beam IB dimension in the Y direction but longer than the ion beam IB dimension in the X direction. The substrate 7 moves in the X direction and intersects with the ion beam IB at least once, and the ion beam IB thereby irradiates the entire surface of the substrate 7.

A profiler 8 is disposed on a wall of the processing chamber 6. Prior to ion implantation processing of the substrate 7, the substrate 7 is either moved to a position not irradiated by the ion beam IB or is not conveyed within the processing chamber 6. At this time, the current distribution in the long-side direction of the ion beam IB is measured by the ion beam IB irradiating the profiler 8.

Also, the transport path of the ion beam IB (hereafter, the "beam path") is covered by a vacuum chamber 5, and the interior of the vacuum chamber 5 is evacuated to a vacuum by a vacuum pump (not shown). Note that the X-, Y-, and Z-axes depicted in FIG. 1 (B) are the coordinate axes for the ion beam IB after it transits the mass analyzing electromagnet 2; when viewed in the X-Z plane, the X-axis and Z-axis directions vary according to the flight path of the ion beam IB. This is because the ion beam IB is deflected by the mass analyzing electromagnet 2, changing the direction of travel of the ion beam IB.

Figure 2:
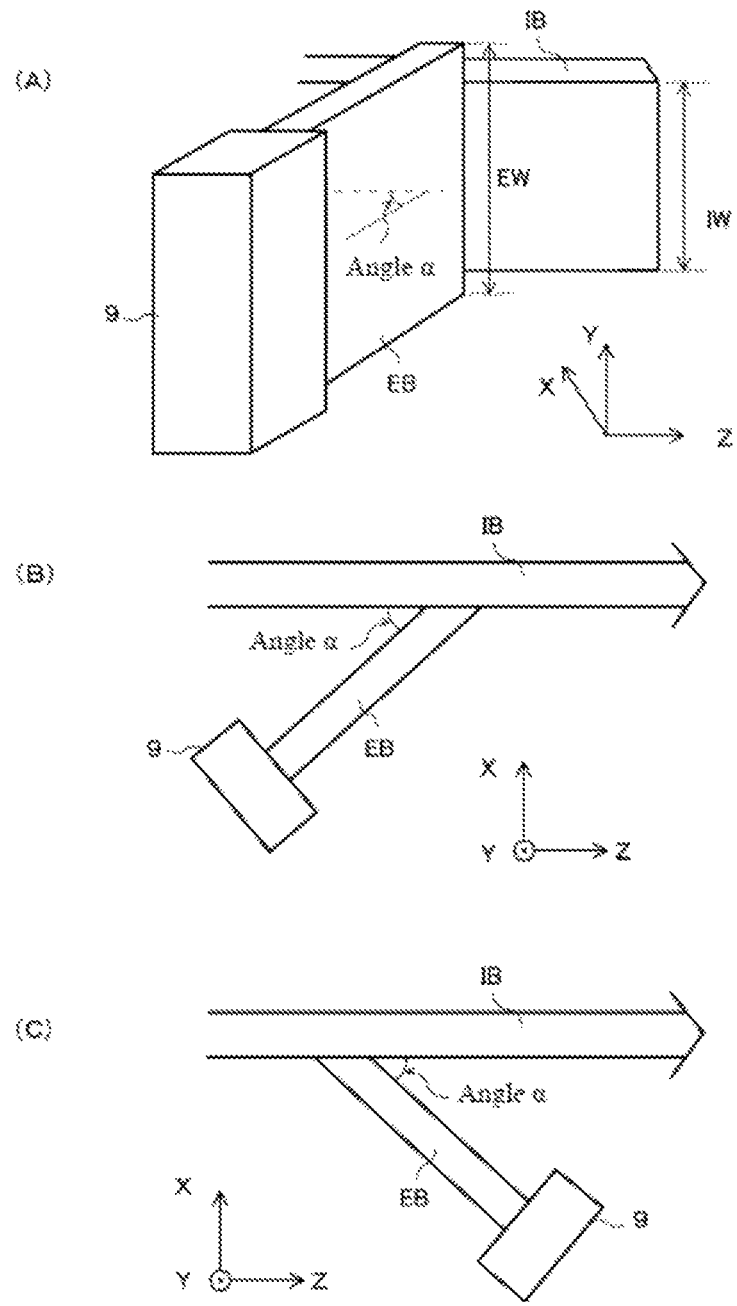
FIG. 2 is an explanatory diagram that illustrates the relationship between the ion beam direction of travel and the irradiation angle of the electron beam. (A) is an oblique view that illustrates a state in which an electron beam is irradiated at the ion beam. (B) is a plan view that illustrates a state when the architecture of (A) is seen from the X-Z plane. (C) is a plan view that illustrates a state in which an architecture that irradiates an electron beam obliquely at an ion beam IB in a direction opposite the Z direction is seen from an X-Z plane.

FIGS. 2 (A) through (C) are explanatory diagrams that illustrate the relationship between the direction of travel of the ion beam IB and the irradiation angle of the electron beam EB. (A) is an oblique view that illustrates a state in which the electron beam EB is irradiated at the ion beam IB. (B) illustrates a state when (A) is seen from the X-Z plane. (C) is a plan view that illustrates a state in which an architecture that irradiates the electron beam EB obliquely at the ion beam IB in a direction opposite the Z direction is seen form the X-Z plane.

As shown in FIG. 2 (A), the supply width EW of the electron beam EB supplied from the electron beam supply unit 9 is larger than the width in the long-side direction IW of the ion beam IB. This allows diffusion of the ion beam IB due to the space-charge effect to be suppressed across the entire area in the long-side direction of the ion beam IB.

Further, the electron beam EB is irradiated in the direction of travel of the ion beam IB inclined at a prescribed angle $\alpha$. It is preferable that this angle $\alpha$ be within roughly 30°, in view of the efficiency of suppressing diffusion of the electron beam EB. Although it also depends on the energy of the electron beam EB, at larger angles than this, for example a 90° angle, the electrons of the electron beam EB will temporarily help suppress diffusion of the ion beam IB, but it is likely that they will soon escape the ion beam IB, collide into the walls of the vacuum chamber 5, and become extinguished. Once this happens, the electrons do not effectively help in suppressing diffusion of the ion beam IB, so large quantities of electrons must be supplied from the electron beam supply unit 9.

The architecture depicted in FIGS. 2 (A) and 2 (B) is an example in which the electron beam EB is irradiated at the downstream side of the beam path; the electron beam may also be irradiated in the opposite direction, at the upstream side of the beam path. Here, "upstream" refers to opposite the Z direction, and "downstream" refers to the Z direction.

FIG. 2 (C) shows an example in which the electron beam EB is supplied opposite the Z direction at an angle to the ion beam IB. For example, an electron source, which is the source that generates electrons described below in the electron beam supply unit 9, of the type equipped with a filament has the advantage of being able to suppress the infiltration of metal particles from the filament when it adopts the architecture illustrated in FIG. 2 (C).

Figure 3:
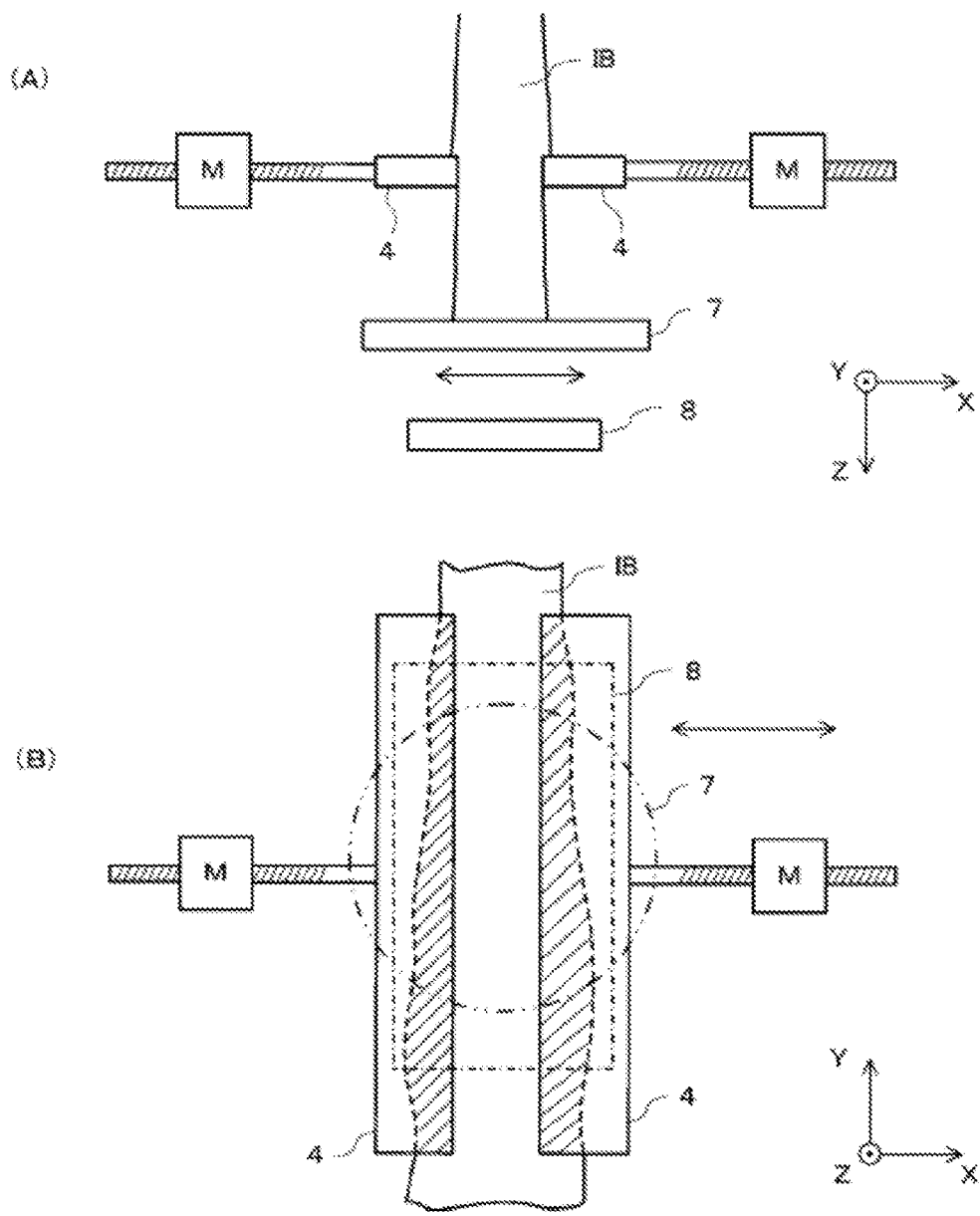
FIG. 3 is a plan view that illustrates a state of an ion beam irradiated at a substrate using the example of the ion implantation apparatus recited in FIG. 1. (A) is a plan view that illustrates a state seen from an X-Z plane. (B) is a plan view that illustrates a state seen from an X-Y plane.

FIGS. 3 (A) and (B) are plan views that illustrate states of the ion beam IB irradiated at the substrate 7 using the example of the ion implantation apparatus depicted in FIG. 1. In these examples, the electron beam EB is not supplied to the ion beam IB.

It is preferable that the shaping masks 4 be constituted so that they can move in the X direction as depicted in FIGS. 3 (A) and 3 (B). In these examples, rod-shaped support pieces are fixed in place at the ends of the shaping masks 4, and the support pieces are constituted so that they can be moved in the X direction by making motors M rotate.

Adopting this architecture allows the width of the shaping masks 4 in the X direction (the distance between the shaping masks 4) to be adjusted. The present invention is constituted so that the two edges in the short-side direction of the ion beam IB spread by the space-charge effect are shaped by the shaping masks 4, and the current distribution in the long-side direction of the shaped ion beam IB is measured by the profiler 8. How much the ion beam IB will spread due to the space-charge effect will vary with the ion source and energy of the ion beam IB.

If the mask width is fixed, the mask width is preset as follows. It is possible to consider the combination of ion source and energy for the ion beam IB determined by the ion implantation apparatus specification that has the smallest spread caused by the space-charge effect and set the mask width so that it can shape the two edges in the short-side direction of the ion beam IB in this case as well.

At the same time, the specifications of the apparatus may change due to improvements in the ion implantation apparatus, and the like. Further, it may not be possible to achieve the desired shaping due to manufacturing error in the shaping masks 4 or variations in the installation locations of the shaping masks 4. A variety of problems can be handled, even in such cases, by making the mask width of the shaping masks 4 variable.

In FIG. 3 (B), the substrate 7 that is placed downstream of the shaping masks 4 is shown by a two-dot chain line, while the profiler 8 that is placed further downstream from the substrate 7 is shown by a one-dot chain line. The dimensions of the profiler 8 at are a minimum larger than those of the substrate 7 in the Y direction. This is because in the long-side direction of the ion beam IB, the entire ion beam IB irradiated on the substrate 7 is measured, and this current distribution must be adjusted. Also, in the Y direction, the dimensions of the profiler 8 do not need to allow measurement of the entire area of the ion beam IB. This is because the edges of the ion beam IB in the Y direction are not irradiated on the substrate 7.

Figure 4:
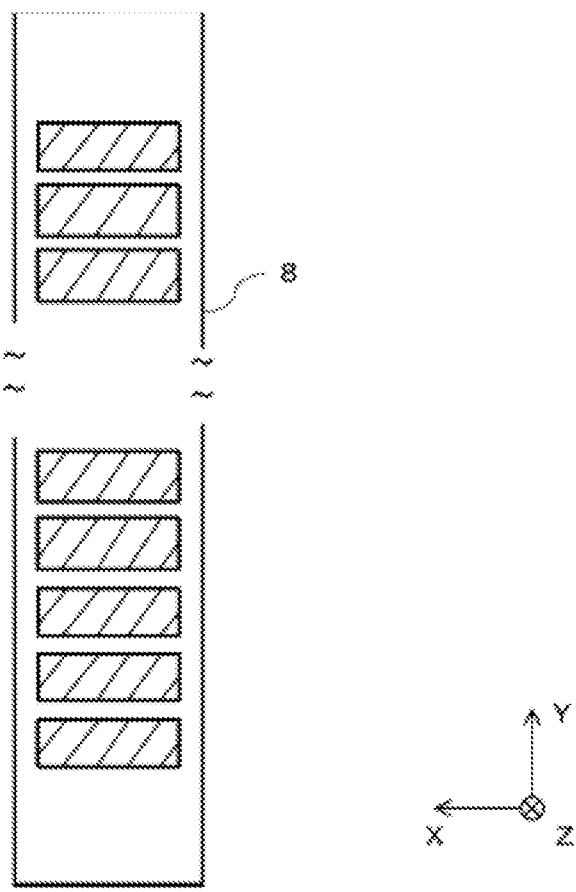
FIG. 4 is a plan view that illustrates an example of the profiler recited in FIGS. 1 and 3.

Multi-point Faraday cups might be used as the plurality of measuring parts (shown by shaded parts) in the Y direction for the profiler 8, as shown in FIG. 4. By using a plurality of Faraday cups, beam current can be measured at each location in the long-side direction of the ion beam IB. Instead of these multi-point Faraday cups, beam current can be measured at each location in the long-side direction of the ion beam IB by moving a single Faraday cup in the Y direction.

Figure 5:
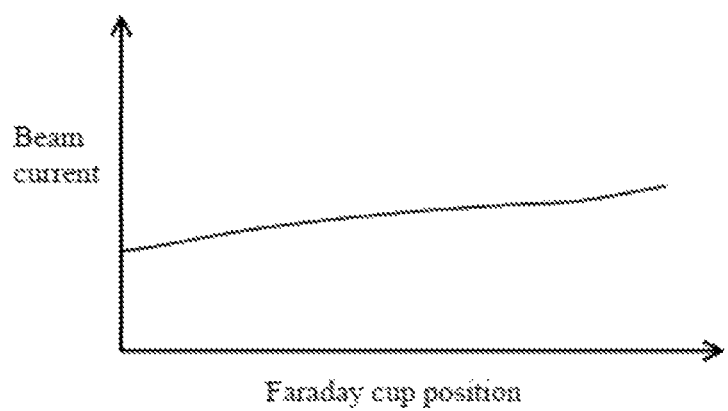
FIG. 5 illustrates the current distribution of an ion beam measured in the example recited in FIG. 3.

FIG. 5 shows the distribution of beam current measured in the architecture depicted in FIGS. 3 (A) and 3 (B). The positions of the Faraday cups shown on the horizontal axis in FIG. 5 might correspond to, for example, the Faraday cup positions that constitute the profiler 8 shown in FIG. 4. Also, the values for beam current depicted on the vertical axis of FIG. 5 might be, for example, the beam current values measured by the Faraday cups that constitute the profiler 8 depicted in FIG. 4. As illustrated in FIG. 5, the current distribution is distributed to increase or decrease from one end to the other end in the long-side direction of the ion beam IB.

With the present invention, the electron beam EB is supplied so that the distribution of this beam current is uniform. When high doses of the ion beam IB transit the shaping masks 4, the value of beam current measured by the profiler 8 becomes large. Conversely, when low doses of the ion beam IB transit the shaping masks 4, the value of beam current measured by the profiler 8 becomes small. In other words, the smaller the diffusion of the ion beam IB, the larger the amount of the ion beam IB passing through the shaping masks 4, so the larger the value of the beam current measured by the profiler 8. Furthermore, the greater the diffusion of the ion beam IB, the smaller the amount of the ion beam IB passing through the shaping masks 4, so the smaller the value of the beam current measured by the profiler 8.

Utilizing this phenomenon, the present invention supplies the electron beam EB across the entire area of the long-side direction of the ion beam IB while also adjusting the current distribution on the long-side direction of the ion beam IB by locally varying the dose of the electron beam EB supplied. The changes in the dose of the electron beam EB supplied are as follows.

If the electron beam EB is spot shaped, the electron beam EB is scanned along one direction by a magnetic field or electric field. The dose of the electron beam EB supplied in the long-side direction of the ion beam IB can be varied locally by appropriately changing the scan speed for each location in the long-side direction of the ion beam IB when scanning the electron beam EB. Specifically, the scanning speed that serves as reference is set in advance. To increase the dose of the electron beam EB supplied relative to the supply dose of the electron beam EB achieved when the electron beam EB is supplied at this scan speed, the scan speed of the electron beam EB is slowed compared to the reference speed. Conversely, to decrease the dose of the electron beam EB supplied, the scan speed of the electron beam EB is increased compared to the reference speed.

The greater the dose of the electron beam EB supplied relative to the supplied dose of the electron beam EB obtained at the electron beam EB scan speed that serves as the reference, the greater the effect in suppressing the diffusion of the ion beam IB. Conversely, the lower the dose of the electron beam EB supplied, the lower the effect in suppressing the diffusion of the ion beam IB. Based on this sort of phenomenon, the scan speed of the electron beam EB is locally varied in the long-side direction of the ion beam according to the current distribution of the ion beam IB measured by the profiler 8.

If the electron beam EB is a ribbon-like electron beam, the current distribution in the long-side direction of the electron beam EB may be varied instead of changing the scan speed. The greater the current of the electron beam EB in parts, the greater the diffusion-suppressing effect in the ion beam IB irradiated at that part. Conversely, the smaller the current of the electron beam EB in parts, the smaller the diffusion-suppressing effect in the ion beam IB irradiated at that part. An adjustment means that employs a multi-pole as disclosed in Patent Document 1, for example, might be used as the means to vary this distribution.

Using FIGS. 6 through 8, an example of an architecture for the electron beam supply unit 9 used by the present invention will be described in detail.

Figure 6:
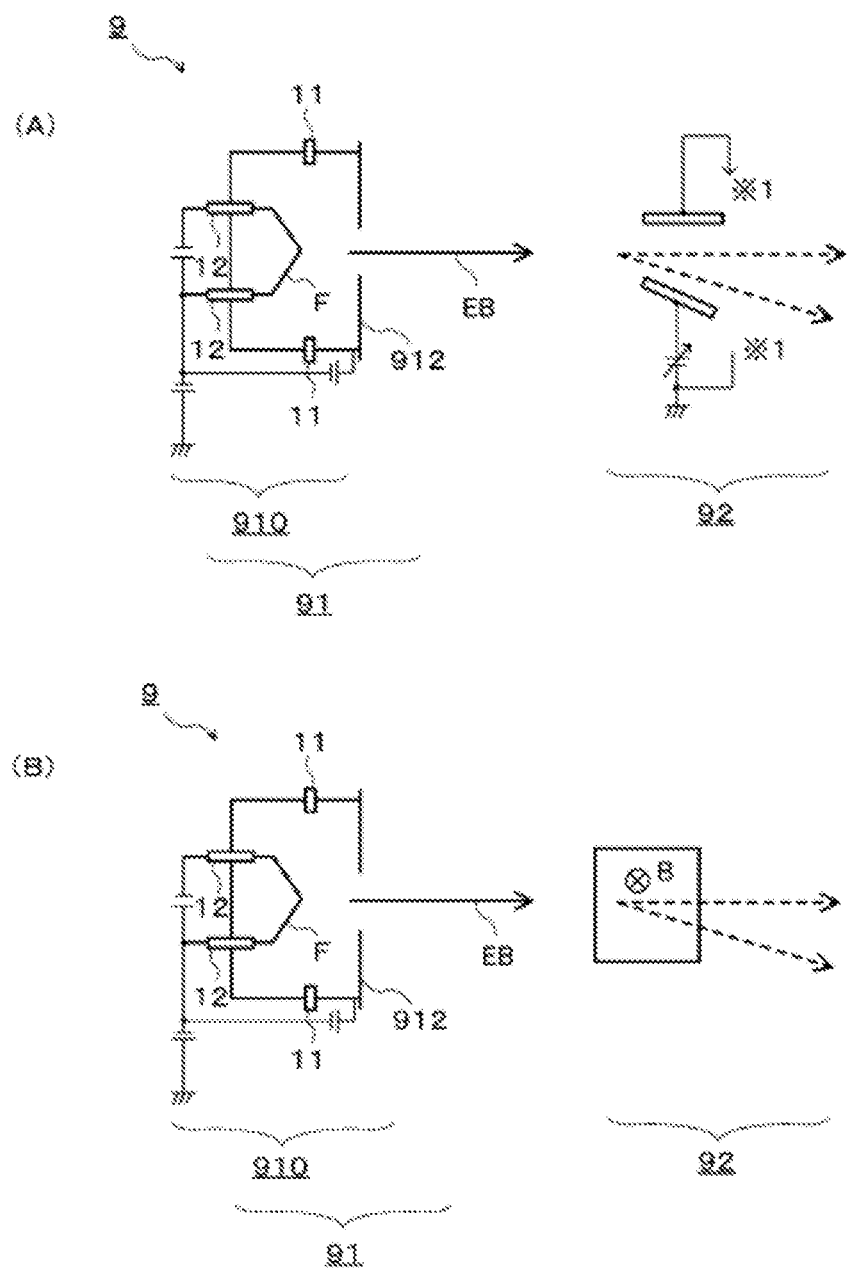
FIG. 6 is a schematic diagram that illustrates an architecture for an electron beam supply unit according to the present invention. (A) is an example of an electron beam supply unit equipped with a beam scanning apparatus that uses an electric field. (B) is an example of an electron beam supply unit equipped with a beam scanning apparatus that uses a magnetic field.

FIGS. 6 (A) and 6 (B) illustrate an electron beam supply unit 9 that supplies a spot-shaped electron beam EB. In this example, the electron beam supply unit 9 is constituted of an electron beam generating apparatus 91, which generates the electron beam EB, and a beam scanning apparatus 92, which scans the electron beam EB along one direction.

The electron beam generating apparatus 91 is illustrated in FIGS. 6 (A) and 6 (B). The electron beam generating apparatus 91 is constituted of an electron source 910 that generates electrons and an extracting electrode 912 that extracts electrons generated by electron source 910 as a beam.

Filament F of the electron source 910 is supported within a chamber, and a voltage is applied between the two terminals through current introduction terminal 12. The filament F is heated up by applying this voltage and sending current through the filament F. When the temperature of the filament F reaches a prescribed temperature, electrons are discharged from the filament F. These electrons are extracted as the electron beam EB by extracting electrode 912, which is mounted in the chamber via insulator 11. A pinhole for extracting the electron beam EB is installed in the extracting electrode 912; since the electron beam EB is extracted through it, the extracted electron beam EB beam has a spot-like cross-section.

After being extracted by the extracting electrode 912, the electron beam EB scans in one direction. The direction of this scanning might match, for example, the long-side direction of the ion beam IB. Further, the scan width is longer than the long side of the ion beam IB. At the same time, the scan width may be long enough to straddle the ion beam IB in the long-side direction of the ion beam IB, with a direction that intersects the long-side direction of the ion beam being the scan direction. Even with this type of architecture, the electron beam EB can be supplied across the entire area of the long-side direction of the ion beam IB.

FIG. 6 (A) illustrates a beam scanning apparatus 92 that uses an electric field, which variably adjusts the intensity of an electric field generated between a pair of electrodes and scans the electron beam EB that passes through it. FIG. 6 (B) illustrates a beam scanning apparatus 92 that uses a magnetic field, which generates a magnetic field B facing the back of the space, variably adjusts the magnetic flux density of the magnetic field B, and scans the electron beam EB that passes through it. The current distribution in the long-side direction of the ion beam IB may also be adjusted by locally varying the scan speed of the electron beam EB in the long-side direction of the ion beam IB using the architectures depicted in these figures.

Figure 7:
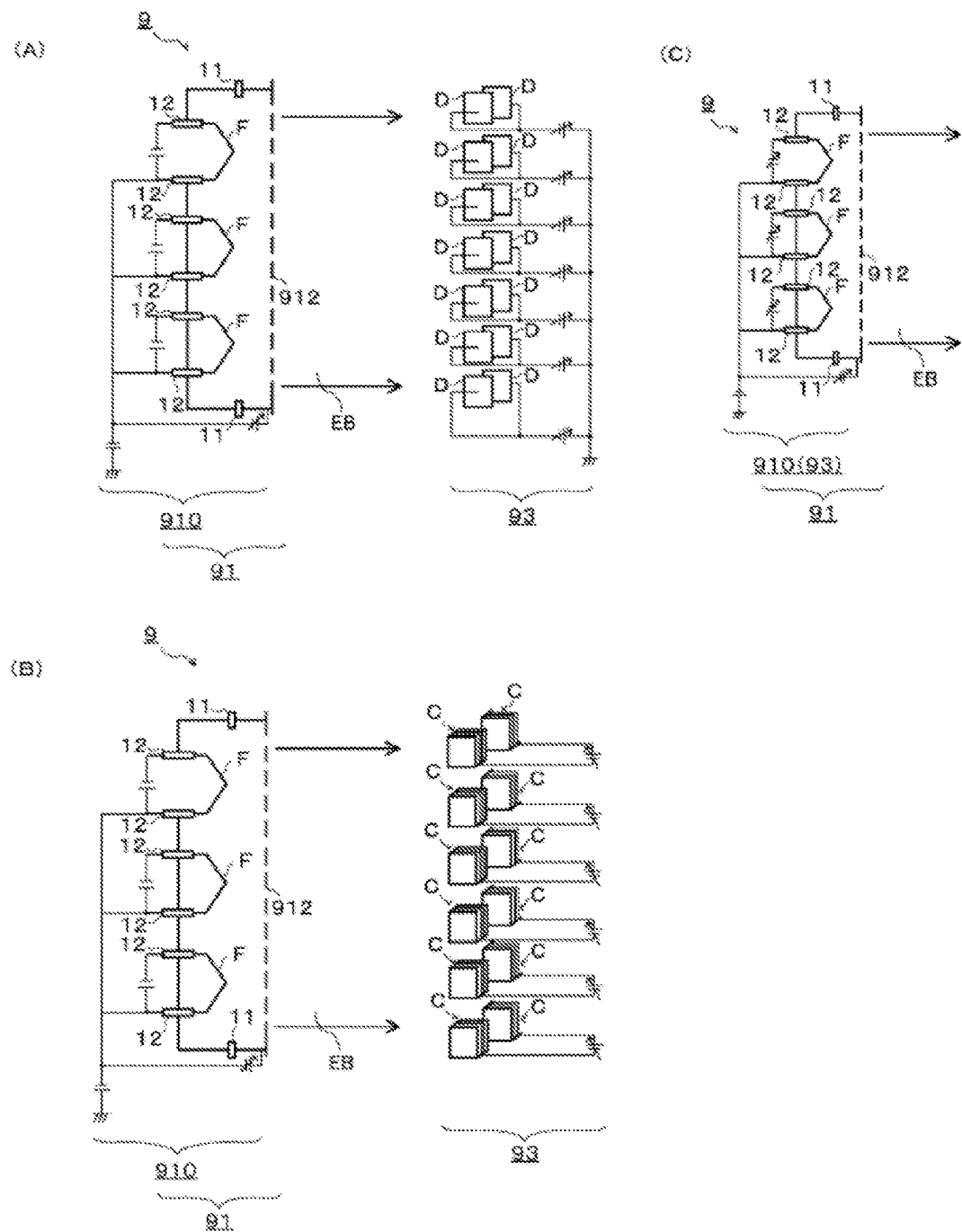
FIG. 7 is a schematic diagram that illustrates another architecture for an electron beam supply unit according to the present invention. (A) is an example of an electron beam supply unit equipped with a current distribution adjusting apparatus that uses an electric field. (B) is an example of an electron beam supply unit equipped with a current distribution adjusting apparatus that uses a magnetic field. (C) is an example of an electron beam supply unit in which the electron source also serves as a current distribution adjusting apparatus.

FIGS. 7 (A) and 7 (B) illustrate an electron beam supply unit 9 that supplies a ribbon-like electron beam EB. The electron sources 910 shown in FIGS. 7 (A) and 7 (B) are the electron sources 910 described in FIGS. 6 (A) and 6 (B) to which a plurality of filaments F have been added. Since their architectures are similar, discussion of parts that have already been explained are omitted.

In the examples of FIGS. 7 (A) and 7 (B), electrons generated from the plurality of filaments F installed in electron source 910 are extracted using extracting electrode 912 which is provided with a plurality of slits or round holes, thereby generating a ribbon-like electron beam EB. The shape of extracting electrode 912, when seen from the direction in which the electron beam EB is extracted, is rectangular. In other words, in the examples of FIGS. 7 (A) and 7 (B), it is longer in the up and down directions of the space than the back and forward directions of the space.

In FIGS. 6 (A) and 6 (B), described above, the value of the voltage applied to extracting electrode 912 was fixed; however, this value may be set variably, as depicted in FIGS. 7 (A) and (B). By using this sort of variable power source, the energy of the electron beam EB extracted can be adjusted. Specifically, power sources that have energy of the electron beam EB and energy that can efficiently suppress spread due to the space-charge effect of the ion beam IB between 1 eV and several eV are used.

The extracted electron beam EB in FIGS. 7 (A) and 7 (B) enters current distribution adjusting apparatus 93. In the example of FIG. 7 (A), a plurality of pairs of electrodes D are disposed along the longitudinal direction of the ribbon-like electron beam EB. In this figure, the electrodes D are shown disposed offset in the direction of travel of the electron beam EB, but these are deliberately shown as offset in order to make it easier to see that the electrodes D are also disposed in the back of the space bracketing the flight path of the electron beam EB; in practice, each pair of electrodes D is disposed in the back to front direction of the space and the electron beam EB transits between them.

Electric fields are generated between each electrode pair by applying the same voltage to the electrode pair and varying the applied voltage values between each electrode pair. The current distribution of the electron beam EB is adjusted by locally varying the direction of travel of the electron beam EB using the action of these electric fields.

Meanwhile, FIG. 7 (B) depicts an architecture for current distribution adjusting apparatus 93 that uses magnetic fields. Specifically, a pair of magnetic poles that extend toward the inside of a yoke are formed in a yoke that has a square-shaped aperture (not shown). A plurality of the magnetic pole pairs are installed along the long-side direction of the electron beam EB and each is wound with a coil C. In FIG. 7 (B), the positions of the magnetic poles that constitute the magnetic pole pairs are depicted as being disposed offset in the direction of travel of the electron beam EB; however, as was explained with the example of the electrode pairs of FIG. 7 (A), they are actually disposed in the back-to-front direction of the space.

Magnetic fields facing the direction in which the magnetic poles protrude are generated by each magnetic pole pair; by adjusting the amount of current passing through the coils C and the orientation of the current, the magnetic field directions and intensities can be changed to prescribed directions and intensities. The current distribution in the long-side direction of the electron beam EB is adjusted by the action of these magnetic fields.

In FIG. 7 (C), no current distribution adjusting apparatus 93 to adjust the current distribution of the electron beam EB by the action of the electric fields and magnetic fields depicted in FIGS. 7 (A) and 7 (B) is installed. In its place, electron source 910 instead plays this role. In this example, a variable power source is connected to both ends of a plurality of filaments F installed in electron source 910. The amount of electrons being discharged from the filaments F is adjusted by this variable power source. The current distribution in the long-side direction of the electron beam EB is thereby adjusted.

Figure 8:
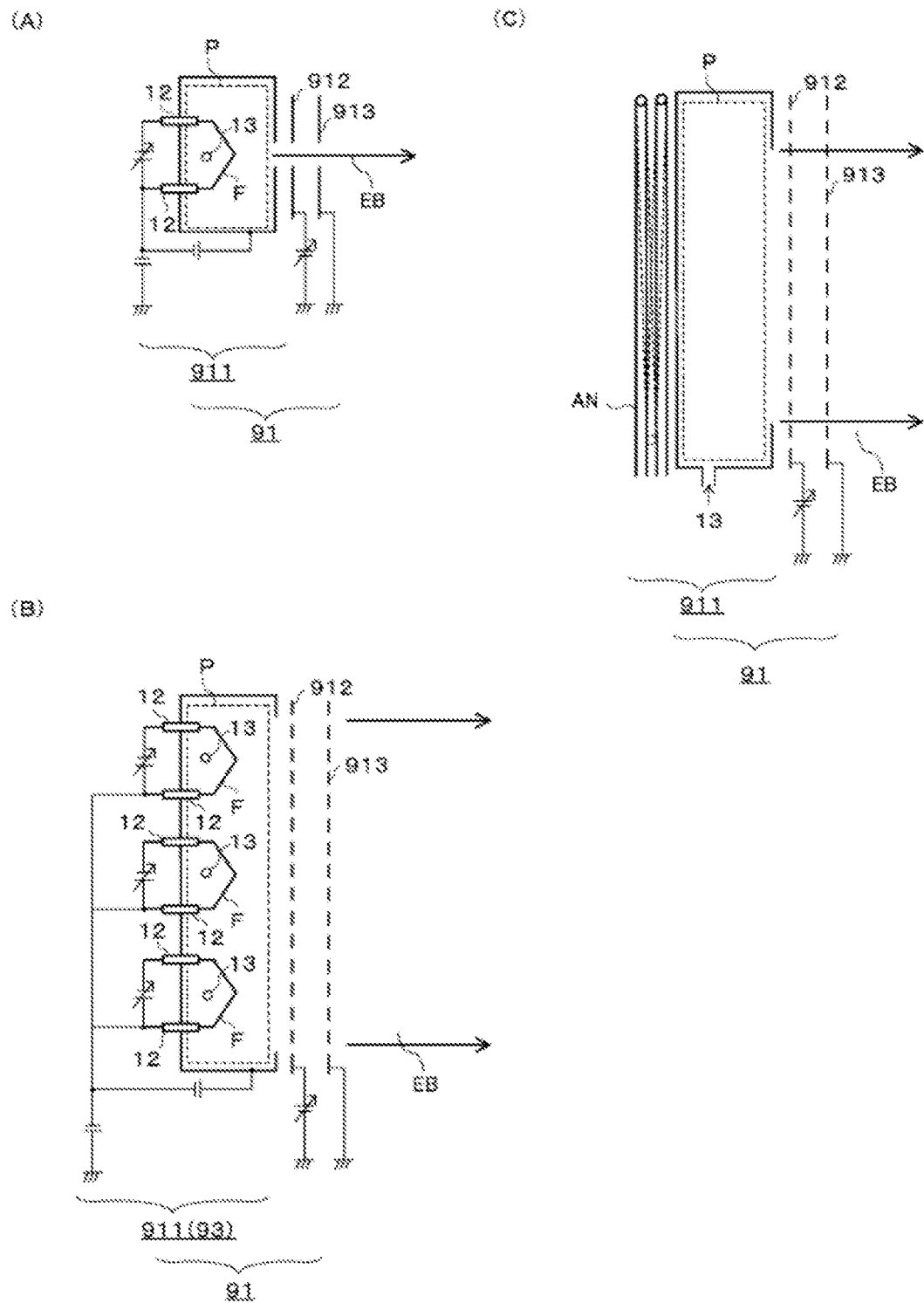
FIG. 8 is a schematic diagram that illustrates another example of the electron beam generating apparatus used in the electron beam supply unit according to the present invention. (A) is an example of an electron beam generating apparatus that has a plasma source equipped with a single filament. (B) is an example of an electron beam generating apparatus that has a plasma source equipped with a plurality of filaments. (C) is an example of an electron beam generating apparatus that has a radio frequency plasma source.

FIGS. 8 (A) through 8 (C) illustrate examples that employ the plasma source 911 instead of the electron source 910 described in the examples of FIGS. 6 and 7. In the examples of FIGS. 8 (A) through 8 (C), the beam scanning apparatus 92 and the current distribution adjusting apparatus 93 are not shown, but the plasma source 911 of FIGS. 8 (A) through 8 (C) and the beam scanning apparatuses 92 and current distribution adjusting apparatuses 93 shown in FIGS. 6 and 7 may be combined to constitute the electron beam supply unit 9 of the present invention.

In FIG. 8 (A), a gas introduction port 13 is installed within the chamber through which gas is introduced. Electrons discharged from the filament F collide with the gas, generating plasma P within the receptacle. A positive voltage is applied to extracting electrodes 912 to extract the electron beam EB from this plasma P. An electron beam generating apparatus 91 of this sort of architecture may also be used. Note that grounding electrode 913 is for locking the potential; this electrode is not essential.

FIG. 8 (B) increases the number of filaments F from the architecture of FIG. 8 (A). In this example, as with the electron beam generating apparatus 91 of FIG. 7 (B), a ribbon-like electron beam EB can be generated. Also, the plasma source 911 of FIG. 8 (B) doubles as current distribution adjusting apparatus 93. Just as in the architecture of FIG. 7 (C), a variable power source is connected to both ends of each filament F. The voltage applied to each filament F is thereby adjusted independently, enabling adjustment of the current distribution across the longitudinal direction of the electron beam EB. Further, the current distribution can also be adjusted across the longitudinal direction of the electron beam EB by independently adjusting the gas flow from the gas introduction ports 13 installed for each filament F. Note that the extracting electrode 912 and grounding electrode 913 of FIG. 8 (B) are the same as in the example of the extracting electrode 912 of FIG. 7 (B), being electrodes whose dimension in the up-down direction of the space is longer than its dimension in the front-back direction of the space and in whose electrode surfaces are formed numerous slits or round holes. The architecture of the electrodes is the same as in FIG. 8 (C), which will be described below.

The plasma source 911 illustrated in FIG. 8 (C) is called a radio frequency plasma source. With this type of plasma source 911, radio frequency current flows through an antenna AN wound in a circular form, gas introduced into the chamber from the gas introduction port 13 is ionized, and the plasma P generated. Thereafter, the electron beam EB is extracted from the plasma P by the extracting electrode 912. This sort of radio frequency model may be used in place of the plasma source 911 equipped with filaments described to this point.

With this sort of architecture, there is no problem of metal particles generated when a filament F is used infiltrating the substrate 7 and causing manufacturing defects in the substrate 7. Also, with the plasma source 911 equipped with filaments F, the filaments F can be sputtered, worn out, or broken by the plasma P. For this reason, the apparatus must be stopped when replacing the filaments F with new filaments, whereas the radio frequency plasma source 911 is not equipped with filaments F, so there is no need to be concerned with this sort of replacement of filaments F due to wear and the like. Thus, when a radio frequency plasma source 911 is used, the electron beam generating apparatus 91 can operate longer and with more stability than a plasma source 911 equipped with filaments F.

Figure 9:
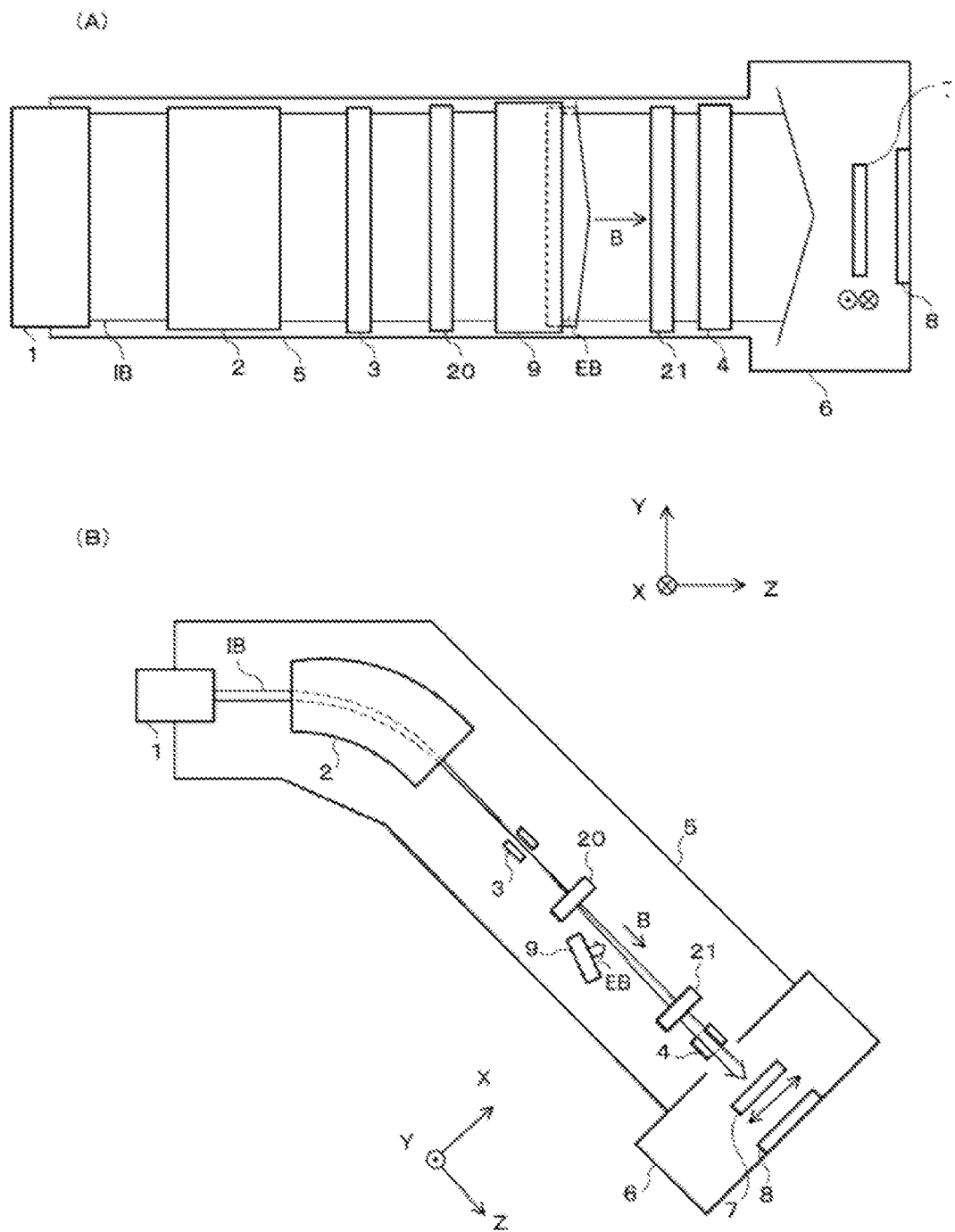
FIG. 9 is a plan view of another ion implantation apparatus according to the present invention. (A) illustrates a state seen from a Y-Z plane; (B) illustrates a state seen from an X-Z plane.

FIG. 9 illustrates another example of an ion implantation apparatus used with the present invention. Since the basic architecture is the same as that depicted in FIG. 1, only those parts that differ from FIG. 1 are described here.

The differences from the architecture of FIG. 1 are that the ion implantation apparatus shown in FIG. 9 disposes a first solenoid coil 20 and a second solenoid coil 21 for generating a magnetic field B roughly parallel to the direction of travel of the ion beam IB on the beam path on which the ion beam IB is transported. Current is passed through these solenoid coils that generates magnetic fields oriented in the same direction.

Although there are some differences depending on conditions such as the angle of irradiation of the electron beam EB and the electron beam EB energy, if this sort of magnetic field B is absent, the electron beam EB supplied to the ion beam IB is likely to cross the ion beam IB, collide into the walls of the vacuum chamber 5, and become extinguished. For that reason, it is difficult to use the electron beam EB to suppress diffusion of the ion beam IB for long periods of time.

Therefore, the architecture illustrated by FIG. 9 is used in order to use the electron beam EB for long periods of time to suppress the diffusion of the ion beam. Solenoid coils are used as depicted in FIG. 9 to generate the magnetic field B in the direction of travel of the ion beam IB. Electrons in the electron beam EB are assisted by the magnetic field B to travel in almost the same direction as the ion beam IB. This enables the electrons in the electron beam EB supplied from the electron beam supply unit 9 to be used for long periods of time in suppressing diffusion of the ion beam IB. The result is the need for a smaller supply dose of electrons and a decrease in the output of the electron beam generating apparatus 91. The power consumption of the apparatus and the wear on the electron source 910 or plasma source 911, which are the sources that generate the electrons, should also be reduced.

FIG. 9 depicts an architecture in which the electron beam EB is supplied between the first solenoid coil 20 and the second solenoid coil 21, but the constitution of the present invention is not limited to that architecture. For example, the electron beam may also be supplied to an area in which a fringing field from the first solenoid coil 20 exists, upstream of the first solenoid coil 20. If this type of architecture is used, the distance at which electrons contribute to diffusion suppression of the ion beam IB lengthens, so the diffusion suppression effect should be even greater.

Also, the orientation of the current that flows through the solenoid coils may be reversed to generate a magnetic field B that has the opposite orientation of the magnetic field B that is shown. The electrons within the electron beam EB travel roughly along the magnetic field B, so even in this type of architecture, the electrons can be made to move along the direction of travel of the ion beam IB.

Figure 10:
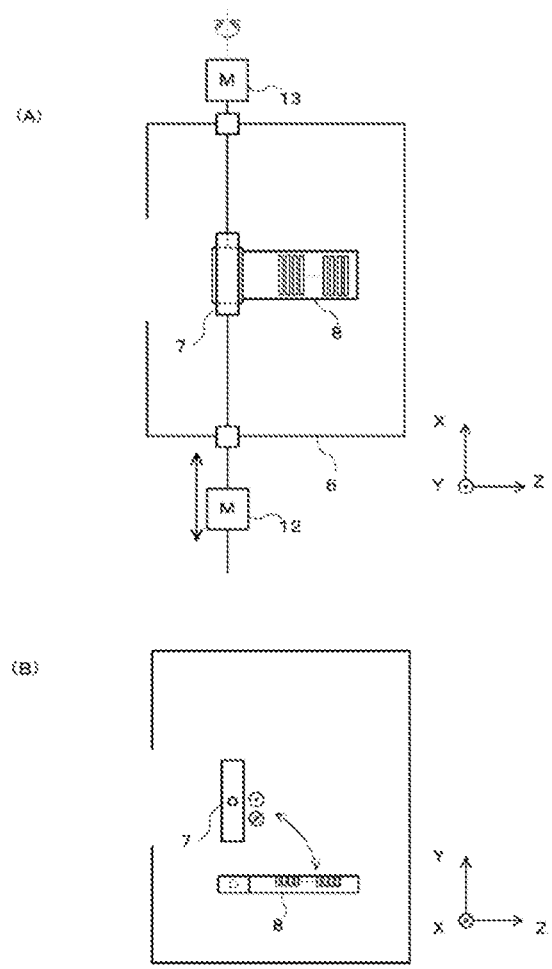
FIG. 10 is a plan view that illustrates another example of the profiler recited in FIGS. 1 and 9. (A) illustrates a state seen from an X-Z plane; (B) illustrates a state seen from a Y-Z plane.
Figure 11:
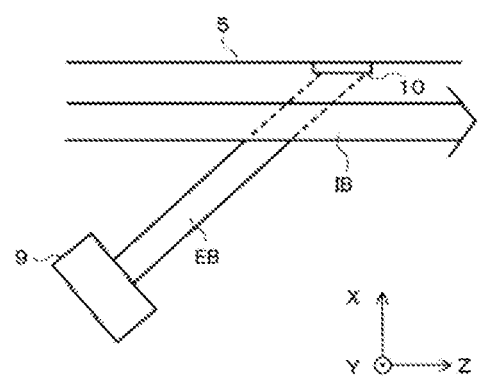
FIG. 11 is a plan view that illustrates an example of a profiler that monitors electron beams from an electron beam supply unit.

The constitution of the profiler 8 may be as illustrated in FIGS. 10 (A) and 10 (B). In the architecture of this example, the substrate 7 is supported by a motor 12 through a wall of a processing chamber 6 on the opposite side in the X direction, as illustrated in FIG. 10 (A), and the motor 12 is driven to move the substrate 7 in the X direction. Meanwhile, the profiler 8 is supported by a motor 13 through a wall of a processing chamber 6 on the X direction side and the motor 13 is driven to rotate the profiler 8 around the X-axis.

Also, as depicted in FIG. 10 (B), the positions of the substrate 7 and the profiler 8 are separated in the Y direction. When implanting ions in the substrate 7, the attitude of the profiler 8 is parallel to the Z direction, as shown, to avoid interference with the substrate 7. Meanwhile, before and after implantation of ions in the substrate 7, the attitude of the profiler 8 is parallel to the Y direction. The changes in the attitude of the profiler 8 described here are accomplished by rotating the profiler 8 using the motor 13. When the attitude of the profiler 8 is parallel to the Y direction, the substrate 7 moves to a position that does not interfere with the profiler 8, at the opposite side in the X direction.

By using this sort of architecture, the current distribution in the long-side direction of the ion beam IB can be measured at the implantation position where the ion beam is irradiated on the substrate 7.

Adjustment of the current distribution of the electron beam EB using the beam scanning apparatus 92 and the current distribution adjusting apparatus 93 may create a prescribed current distribution by running tests in advance and setting adjustment parameters (voltage values for each power source, current flows through coils, etc.) based on those experimental results, but adjustments may also be performed by measuring the electron beam EB in advance, prior to supplying the electron beam EB to the ion beam IB.

Specifically, a profiler 10 for measuring the current distribution of the electron beam EB is affixed with a bolt or the like to the inside wall of the vacuum chamber 5. The profiler 10 is installed at a position on the inside wall of the vacuum chamber 5 where the electron beam is irradiated when no ion beam is being irradiated on the beam path. Further, the profiler 10 is longer along the scanning direction, if the electron beam EB is on a spot, or along the long-side direction, if it is a ribbon-like electron beam EB, and measures the current distribution of the electron beam EB in that direction. With this sort of architecture, the current distribution of the electron beam EB is measured and the current distribution of the electron beam EB is adjusted based on the measurements prior to its supply to the ion beam IB, so the current distribution can be adjusted accurately.

In the above embodiment, the example described an electron source 910 equipped with a filament F and a plasma source 911, but an indirectly heated cathode may be used in place of this type of filament F. Also, the inlet part through which the ion beam IB enters the processing chamber 6 may be processed appropriately so that this part is used as the shaping mask 4.

Also, the direction of movement of the substrate 7 has been described as moving in the direction along the X direction, but depending on the architecture of the semiconductor device, the angle of irradiation of the ion beam IB on the substrate 7 may be an angle other than 90°, so the substrate 7 may be moved in a direction that intersects the X direction at an angle.

Also, the adjustment of the current distribution in the long-side direction of the ion beam IB thus far described may be an architecture that records an adjustment program on a control apparatus that adjusts various parameters of ion implantation apparatuses and enables auto-adjustment using this sort of control apparatus, and manual adjustments may be performed in place of using a control apparatus.

In addition, various improvements or changes may of course be made other than those described above, so long as they do not depart from the spirit of the present invention.

I claim:

1. An ion implantation apparatus that moves a substrate in a direction that intersects the short-side direction of a ribbon-like ion beam in a processing chamber to thereby irradiate the ion beam over the entire surface of the substrate, comprising:
    shaping masks that shape the two edges of the ion beam in the short-side direction prior to irradiation of the ion beam on the substrate;
    a profiler that measures the current distribution in the long-side direction of the ion beam shaped by the shaping masks and
    an electron beam supply unit that supplies an electron beam for the ion beam across the entire region in the long-side direction of the ion beam on the upstream side of the shaping masks, wherein the electron beam supply unit varies the supply dose of the electron beam at each location in the long-side direction of the ion beam according to results of measurements by the profiler.

2. The ion implantation apparatus according to claim 1, wherein the electron beam supply unit comprises: an electron beam generating apparatus, which generates the electron beam, and at least one of an electron beam scanning apparatus, which scans the electron beam generated by the electron beam generating apparatus in one direction, and a current distribution adjusting apparatus, which adjusts the current distribution of the electron beam generated by the electron beam generating apparatus.

3. The ion implantation apparatus according to claim 2, wherein the electron beam generating apparatus comprises: a radio frequency plasma source and an extracting electrode that extracts an electron beam from a radio frequency plasma source.

4. The ion implantation apparatus according to claim 1, wherein at least one solenoid coil that generates a magnetic field roughly parallel to the direction of travel of the ion beam is disposed on the beam path on which the ion beam is transported.

5. The ion implantation apparatus according to claim 1, wherein the beam path on which the ion beam is transported is covered by a vacuum chamber and the profiler that measures the current distribution of the electron beam is supported on a wall of the vacuum chamber.

6. The ion implantation apparatus according to claim 1, wherein prior to ion implantation processing of the substrate, the profiler that measures the current distribution of the ion beam is disposed at an implantation position where the ion beam is irradiated on the substrate during ion implantation.

7. The ion implantation apparatus according to claim 1, wherein the shaping masks comprise: a mask-width-varying apparatus that can variably change the mask width in the short-side direction of the ion beam.

* * * * *